(12) United States Patent
Behin-Aein et al.

(10) Patent No.: US 9,379,313 B2
(45) Date of Patent: Jun. 28, 2016

(54) NON-VOLATILE SPIN SWITCH

(71) Applicant: Purdue Research Foundation, West Lafayette, IN (US)

(72) Inventors: Behtash Behin-Aein, Campbell, CA (US); Supriyo Datta, West Lafayette, IN (US)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 0 days.

(21) Appl. No.: 14/425,320

(22) PCT Filed: Aug. 30, 2013

(86) PCT No.: PCT/US2013/057700
§ 371 (c)(1),
(2) Date: Mar. 2, 2015

(87) PCT Pub. No.: WO2014/036510
PCT Pub. Date: Mar. 6, 2014

(65) Prior Publication Data
US 2015/0236247 A1 Aug. 20, 2015

Related U.S. Application Data

(60) Provisional application No. 61/696,158, filed on Sep. 1, 2012.

(51) Int. Cl.
*G11C 11/00* (2006.01)
*H01L 43/08* (2006.01)
(Continued)

(52) U.S. Cl.
CPC ................ *H01L 43/08* (2013.01); *G11C 11/16* (2013.01); *G11C 11/18* (2013.01); *G11C 11/48* (2013.01); *G11C 11/1673* (2013.01)

(58) Field of Classification Search
CPC ........ H01L 43/08; G11C 11/16; G11C 11/18; G11C 11/48; G11C 11/1673
USPC .............................. 365/158, 148, 66, 97, 171
See application file for complete search history.

(56) References Cited

U.S. PATENT DOCUMENTS 7,732,881 B2 * 6/2010 Wang ..................... G11C 11/15
257/295
8,558,571 B2 * 10/2013 Behin-Aein ........... H03K 19/16
326/104

(Continued)

OTHER PUBLICATIONS

Datta, et al., What constitutes a nanoswitch? A Perspective. In "Emerging Nanoelectronic Devices," Editors: An Chen, James Hutchby, Victor Zhirnov and George Bourianoff, John Wiley & Sons (to be published), 2014.

*Primary Examiner* — Viet Q Nguyen
(74) *Attorney, Agent, or Firm* — Purdue Research Foundation

(57) ABSTRACT

A circuit element includes first and second nanomagnets and first and second fixed magnets. The first nanomagnet is inductively coupled to a first current carrying element, and is configured to change polarity responsive to current in the first current carrying element. In one example, the first current carrying element includes a spin Hall effect substrate. The second nanomagnet is magnetically coupled to the first nanomagnet, and is inductively coupled to a second current carrying element. The first fixed magnet is disposed on the second nanomagnet and has a first fixed polarity, and second fixed magnet disposed on the second nanomagnet and has a second fixed polarity.

20 Claims, 15 Drawing Sheets

(51) Int. Cl.
*G11C 11/16* (2006.01)
*G11C 11/18* (2006.01)
*G11C 11/48* (2006.01)

(56) References Cited

U.S. PATENT DOCUMENTS

| | | | | |
|---|---|---|---|---|
| 8,947,170 B2* | 2/2015 | Yang | ................... | H03B 15/006 257/295 |
| 9,001,574 B2* | 4/2015 | Fuhrer | ............... | G11C 11/1673 365/148 |
| 9,117,521 B2* | 8/2015 | Guillemenet | ........ | G11C 11/161 |
| 9,269,415 B1* | 2/2016 | Liu | ................... | G11C 11/1675 |
| 2009/0154030 A1* | 6/2009 | Yamada | ................. | B82Y 25/00 360/319 |
| 2013/0200446 A1* | 8/2013 | Wunderlich | ............ | H01L 29/82 257/295 |
| 2014/0264513 A1* | 9/2014 | De Brosse | ............ | H01L 43/065 257/295 |
| 2015/0213866 A1* | 7/2015 | Wu | ....................... | G11C 11/161 365/158 |
| 2015/0213867 A1* | 7/2015 | Wu | .................... | G11C 11/1675 365/158 |
| 2015/0269478 A1* | 9/2015 | Datta | ................... | G06N 3/063 706/33 |

* cited by examiner

NON-VOLATILE SPIN SWITCH

CROSSS REFERENCE TO RELATED APPLICATIONS

This application claims the benefit of, and is a U.S. §371 national stage entry of, International Patent Application Ser. No. PCT/US2013/57700 filed Aug. 30, 2013 which is related to and claims priority to U.S. Provisional Patent Application Ser. No. 61/696,158, filed Sep. 1, 2013, which is incorporated herein by reference.

FIELD OF THE INVENTION

The present invention relates generally to electronic circuit components and in particular to components that are based on spin transport and spin magnet interactions.

BACKGROUND

Since the advent of electronic circuits, the miniaturization of transistors and logic devices has been a universal goal to advance the capabilities and applicability of electronic devices. The roadblocks to continued miniaturization are well recognized and experts have urged the need to "reinvent the transistor". A key component to miniaturization is the reduction in operating voltage. One of the alternative approaches that hat recently received attention is nanomagnet logic (NML) using a nanomagnet to switch another nanomagnet using electron spin currents.

U.S. patent application Ser. No. 13/345,588, filed Jan. 6, 2012, which is incorporated herein by reference, teaches an all-spin logic nanomagnetic circuit in which a first nanomagnet imparts its current magnetic state to a second nanomagnet via spin currents that propagate through a spin coherent channel between the nanomagnets. Referring briefly to FIG. 1, a schematic block diagram of such an all-spin logic device 10 is shown. The device 10 includes a first nanomagnet 12, a second nanomagnet 14, and a spin-coherent channel 16. Each of the nanomagnets 12, 14 has one of two spin or magnetic "states". The circuit 10 is a simplified circuit in which the current state of the first nanomagnet 12 can be propagated onto the second nanomagnet 14 via application of a bias voltage to both nanomagnets.

In particular, upon application of the bias voltages, the bias voltage interacts with the current magnetic state of the first nanomagnet 12 to impart a spin current onto the spin coherent channel 16. The spin current has a magnetic polarity that corresponds to the magnetic state of the first nanomagnet 12. Thus, the spin current carries the information that is stored in the first nanomagnet 12. The spin current propagates to the second nanomagnet 14. The operation of the spin current and the bias voltage on the second nanomagnet 14 causes the second nanomagnet 14 to assume the "state" of the first nanomagnet 12.

A drawback to the circuit shown in FIG. 1 is that spin currents are not suitable for transmission through ordinary conductors, and require a specifically designed spin-coherent channel 16. Moreover, the spin currents have limited range within the spin-coherent channel 16, particularly at room temperature and elevated temperatures. The limitations on the propagation of spin currents renders the combinations of such devices impracticable.

Accordingly, there is a need for a practical implementation of a nanomagnet device that avoids at least some of the shortcomings of all-spin logic nanomagnetic devices and allows for versatility and scalable circuits.

SUMMARY

The above-described need, as well as others, are satisfied by at least some embodiments of a nanomagnetic circuit that employs charged-coupled spin logic.

A first embodiment is a circuit element that includes first and second nanomagnets and first and second fixed magnets. The first nanomagnet is inductively coupled to a first current carrying element, and is configured to change polarity responsive to current in the first current carrying element. In one example, the first current carrying element includes a spin Hall effect substrate. The second nanomagnet is magnetically coupled to the first nanomagnet, and is inductively coupled to a second current carrying element. The first fixed magnet is disposed on the second nanomagnet and has a first fixed polarity, and second fixed magnet disposed on the second nanomagnet and has a second fixed polarity.

The first and second fixed magnets can be used, upon application of appropriate bias voltages, to cooperate with the second nanomagnet to produce a current flow having a direction that is indicative of the magnetic state or spin state of the second nanomagnet. The produced current thus carries "information" that is not reliant on spin currents alone, and can be readily employed in larger circuit combinations.

The above-described features and advantages, as well as others, will become more readily apparent to those of ordinary skill in the art by reference to the following detailed description and accompanying drawings.

BRIEF DESCRIPTION OF THE DRAWINGS

FIG. 12 is a third timing diagram illustrating the operation of the circuit of FIG. 10;

DETAILED DESCRIPTION

Figure 2:
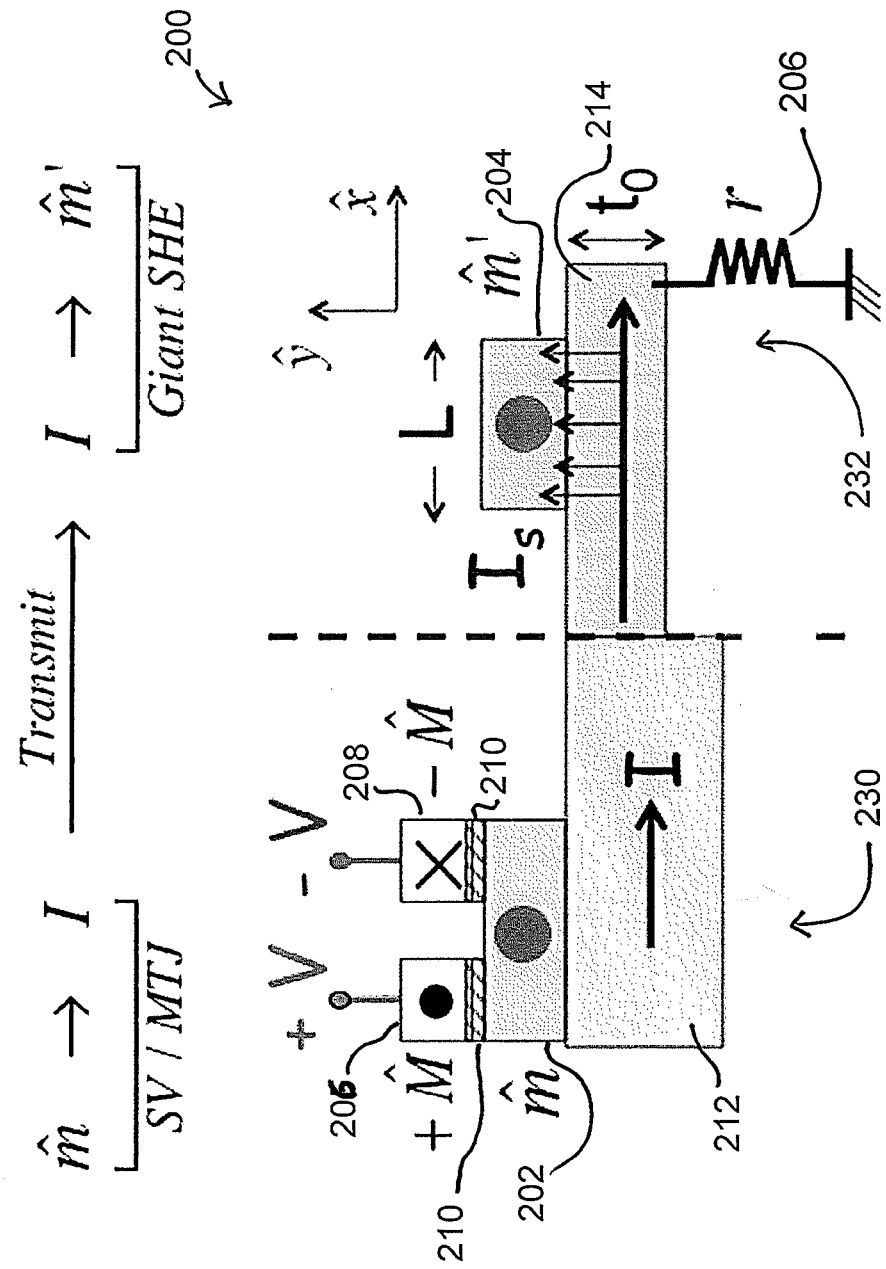
FIG. 2 shows a schematic diagram of a charged coupled nanomagnet device according to a first embodiment of the invention.

FIG. 2 shows a schematic diagram of a charged coupled nanomagnet device 200 that illustrates the underlying theory of operation of at least some embodiments of the invention. In general, the nanomagnet device 200 includes a first nanomagnet 202 having a first of two possible magnetic states, and a second nanomagnet 204 having one of two possible magnetic states. The operation of the device 200 illustrates how magnetic state information can be transferred from the first nanomagnet 202 to the second nanomagnet 204 using charge-coupled spin logic. The nanomagnets 202, 204 may suitably have the general construction of the nanomagnets of U.S. patent application Ser. No. 13/345,588. In this embodiment, the nanomagnets 202, 204 may suitably be CoFeB magnets having a thickness of on the order of 2 nanometers.

In general, the device 200 further includes a first fixed magnet 206, a second fixed magnet 208, at least one oxide layer 210, a conductor 212, a giant spin Hall effect ("GSHE") channel or substrate 214, and a terminal impedance 216. The first fixed magnet 206 is preferably formed as a nanopillar of permalloy, CoFeB or other magnetic material. The first fixed magnet 206 has a predetermined, and, for practical purposes, fixed polarity or magnetic state. For example, the first fixed magnet 206 may have a magnetization direction extending out from the paper as shown in FIG. 2. To this end, the material and/or thickness of the first fixed magnet 206 should be chosen such that its magnetic state is not as changeable as the nanomagnetics. For example, if formed of CoFeB, the first fixed magnet 206 should have a thickness several times that of the thickness of the nanomagnets 202, 204.

Similarly, the second fixed magnet 208 has a similar structure and also has a predetermined and fixed polarity or magnetic state which is anti-parallel of that of the first fixed magnet 206. In this example, the second fixed magnet 208 may have a magnetization direction extending into the paper as shown in FIG. 2. The first fixed magnet 206 is disposed above a first side of the first nanomagnet 202, and the second fixed magnet 208 is disposed above a second side of the first nanomagnet 204.

The first fixed magnet 206 and the second fixed magnet 208 are separated by from the first nanomagnet 202 by portions of the oxide layer 210. The oxide layer 210 should be configured to allow a spin valve or magnetic tunnel junction to develop between each of the fixed magnets 206, 208 and the first nanomagnet 202 the first nanomagnet 202 is in the corresponding state. The details generating spin valves and magnetic tunnel junctions are known.

The first nanomagnet 202 is disposed on the conductor 212. The conductor 212 may be any suitable conductor, including a copper or other conductive magnetic substance. The conductor 212 is operably coupled to a first end of the GSHE channel 214. The termination impedance 216 is operably connected to the second (opposite) end of the GSHE channel 214. GSHE channel 214 is a thin layer of tantalum, tungsten or platinum. The second nanomagnet 204 is disposed on the GSHE channel 214 at location between the first end and the second end.

In general, the device 200 actually includes two component devices, a read element 230 and a write element 232. The read element 230 includes the first nanomagnet 202, the fixed magnets 206, 208, the at least one oxide layer 210, and the conductor 212. As will be discussed below, the read element 230 is designed to "read out" the state of the nanomagnet 202 using the current I in the conductor 212. The write element 232 includes the GSHE channel or substrate 214, the second nanomagnet 204, and the impedance 216. As will be discussed below, the write element is designed to "write" information, based on the current I, to the second nanomagnet 204. The device 200 thus operates to read out the information of the magnetic state of the first nanomagnet 202 and write that information to the second nanomagnet 204.

In the operation of the device 200, a positive bias voltage V+ is applied to the first fixed magnet 206, and a negative bias voltage V− is applied to the second fixed magnet 208. The orientation of the magnetic polarity of the nanomagnet 202 creates a spin valve or magnetic tunnel junction between the first nanomagnet 202 and one of the two fixed magnets 206, 208. Thus, if the first nanomagnet 202 has a first magnetic state (e.g. a first polarity), then a magnetic tunnel junction is created between the first fixed magnet 206 and the nanomagnet 202. If the first nanomagnet 202 has the second magnetic state (i.e. a second polarity), then a magnetic tunnel junction is created between the second fixed magnet 208 and the first nanomagnet 202. The magnetic tunnel junction creates a low impedance path through which the bias voltage V+ or V− may flow from the fixed magnets 206 or 208 to the terminal impedance 216.

The direction of the current I through the conductor 212 and the GSHE substrate 214 controls the magnetic state of the second nanomagnet 204. This control is a result of the spin Hall effect. In particular, if the current flows in a first direction (from V+ to ground), then the second nanomagnet 204 will change to (or stay in) the first magnetic state. If, however, the current flows in the second direction (from ground to V−), then the second nanomagnet 204 will change to (or stay in) the second magnetic state. To this end, the GSHE substrate 214 operates to create a spin Hall effect at or near the second nanomagnet 204. The spin Hall effect is one in which electrons of different polarity spin currents are separated into different directions. To this end, the GSHE substrate material causes the electrons with a first polarity spin to propagate a first spin current in a first direction away from the main current flow, and electrons with a second polarity spin to propagate a second spin current in a second direction away from the main current flow. As a result, current flowing from V+ to ground forces $e^+$ spin electrons in a first direction and $e^-$ spin electrons in a second direction. Contrariwise, current flowing from ground to V− forces $e^-$ spin electrons in the first direction and $e^+$ spin electrons in the second direction.

The clustering of the spin electrons in opposite sides imparts a magnetic state onto the nanomagnet 204. Thus, current flowing from V+ to ground causes the nanomagnet 204 to be in the first magnetic state, and current flowing from ground to V− causes the nanomagnet 204 to be in the second magnetic state. Accordingly, the overall operation is such that the state of the first nanomagnet 202 dictates the state of the second nanomagnet 204, provided the current I is of sufficient magnitude, which will be discussed further below.

One of the advantages of the device 200 is that the current flowing through the conductor 212 and GSHE substrate 214 can be of significant magnitude, thus allowing for separation of the nanomagnets 202, 204 using a conductor 212 of significant length. Because the "information" about the state of the first nanomagnet 202 is carried by the "direction" of the current, the length of conductor 212 or amount of separation between the nanomagnets 202, 204 is less significant. By contrast, the prior art all-spin logic device 100 relied on spin currents to carry information, which can only propagate information over short distances, and further requires a spin coherent channel 16 for the entire distance.

Figure 3:
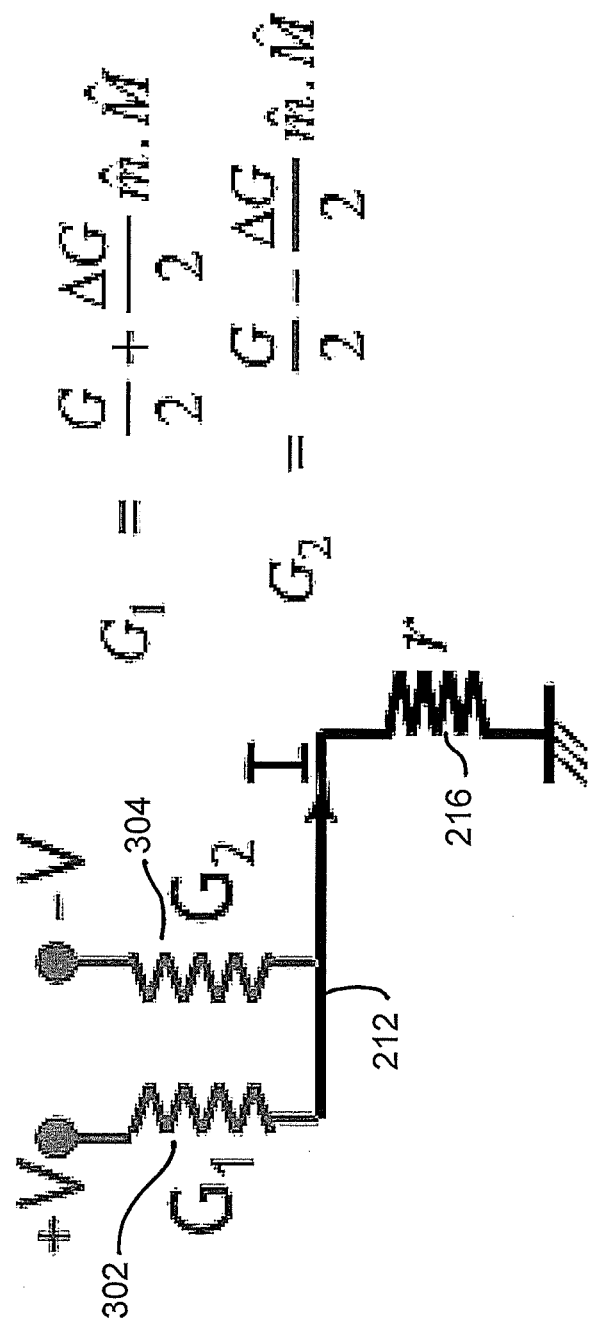
FIG. 3 shows an equivalent electrical schematic diagram of the device of FIG. 2.

FIG. 3 shows an equivalent electrical schematic diagram of the device 200 of FIG. 2. The conductance 302 represents the current path through the first fixed magnet 206, the oxide layer 210 and the first nanomagnet 202, while the conductance 304 represents the path through the second fixed magnet 208, the oxide layer 210 and the first nanomagnet 202. The conductance 302 has a conductance value of $G_1$, and the conductance 304 has a conductance value of $G_2$. The values of $G_1$ and $G_2$ depend on the magnetic state of the first nanomagnet 202, and hence, the magnetic tunnel junctions associated with each fixed magnet 206, 208. Referring to both FIGS. 2 and 3, it can be seen, therefore, that if the first nanomagnet 202 is in the first magnetic state, then the magnetic tunnel junction raises the value of $G_1$ and the low impedance path is formed between the V+ and ground. As a result, a current flows from V+ to ground. On the other hand, if the first nanomagnet 202 is in the second magnetic state, then the magnetic tunnel junction raises the value of $G_2$ and the low impedance path is formed between V− and ground. As a result, a current flows in the opposite direction, from ground to V−.

In further analytical detail, assume that G and ΔG represent the sum and difference, respectively, of the parallel ($G_P$) and anti-parallel ($G_{AP}$) conductances of the actual magnetic tunnel junctions through the oxide layer(s) 210. This circuit leads straightforwardly to the following expression for the current:

$$I = \frac{V\Delta G}{1+rG} \hat{m} \cdot \hat{M} \tag{1}$$

The current is thus proportional to the component of the input magnetization along a fixed direction $\hat{M}$ determined by the fixed magnets 206, 208. It should be noted that the magnitude of the current for a given voltage V is determined by $\Delta G = G_P - G_{AP}$. It has been shown that a magnetic tunnel junction between a CoFeB fixed magnet (e.g. 206, 208) and a MgO nanomagnet (e.g. 202) has a resistance-area product of $A/G_P = 18$ ohm-m². As a result, the $G_P = 0.45$ mS can be estimated, which with a TMR of 150% should provide $$\Delta G = G^P * TMR/(TMR+1) = 0.25 \text{ mS}$$

It should also be noted that the corresponding conductance G is $\sim(1.5$ kilo-ohm$)^{-1}$ so that for a resistance $r \ll 1$ kilo-ohm, the denominator in Eq. (1) can be ignored.

Referring again to FIG. 2, the GHSE substrate 214 is formed of high spin-orbit materials like platinum or tantalum. A charge current I gives rise to a spin current $I_s$ that carries z spins in the y direction $$\vec{I} = \beta I z \tag{2a}$$

where $$\beta = \text{Spin-Hall Angle} * (A_s/A) \tag{2b}$$

where $A_s$ and A are the cross-sectional areas for the spin current and charge currents, respectively. For a magnet with L=80 nm, this ratio could be ~50 if the thickness to of the high spin-orbit metal layer (GSHE substrate 214) is 2 nm. Based on the demonstrated spin-Hall angle of 0.2 in tantalum, this would give a charge to spin amplification factor of β=8.

If $I_{s,c}$ represents the critical spin current required to switch the magnet, then the charge current I that is needed is given by $I \geq I_{s,c}/\beta$. Thus, the voltages V+ and V− in FIG. 2 must be chosen such that I, when amplified by the spin amplification factor β, will be greater than the critical spin current ($I_{s,c}$). Given material parameters similar to those discussed in T. Kimura, Y. Otani, T. Sato, S. Takahashi, S. Maekawa, "Room-temperature reversible spin Hall effect," Phys. Rev. Lett. 98, 156601 (2007), which is incorporated herein by reference, a critical spin current density can be estimated as $$J_{s,c} = (2q/\hbar)\alpha\mu_0 M_s t_0 (H_K + M_s/2) \sim 3 \times 10^6 \text{ A/cm}^2$$

where the damping parameter α~0.01, saturation magnetization $\mu_0 M_s$~1T, thickness $t_0$~1.6 nm and the coercive field $H_K \ll M_s$. This gives a critical spin current $I_{s,c}$~240 μA for a nanomagnet 204 of width W~100 nm in the direction perpendicular to the page in FIG. 2. With a β of 8, thereby a charge current I of 30 μA would be needed.

Figure 4:
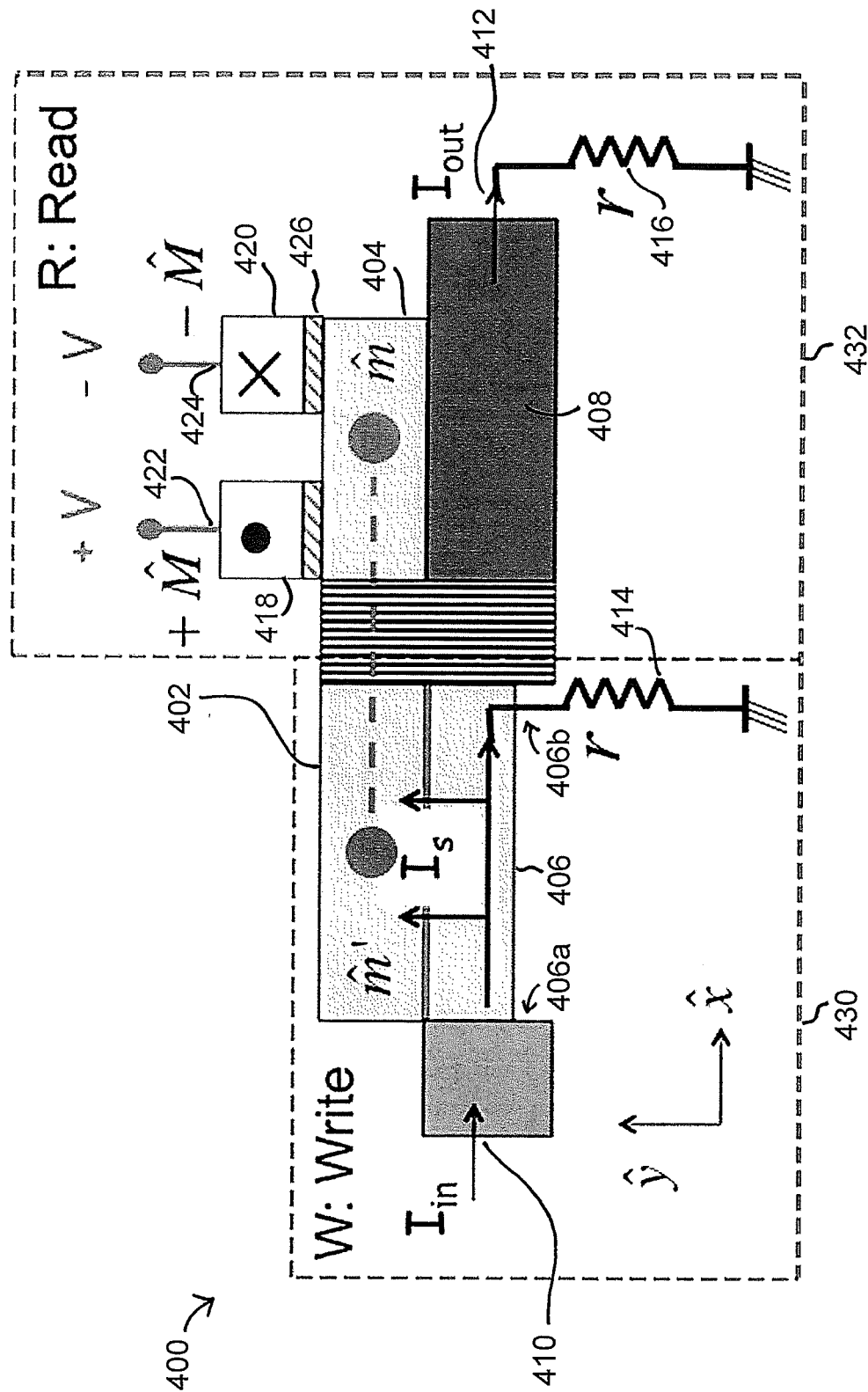
FIG. 4 shows a circuit element in the form of a magnetic spin switch according to a second embodiment of the invention.

The principles of the device 200 can be employed, along with other features, to create a concatenable spin device. FIG. 4 shows a circuit element in the form of a magnetic spin switch 400 that implements the principles of the device 200 of FIG. 2. In general, the switch 400 is a bistable device that includes a write unit 430 similar to the write element 232, and a read unit 432 similar to the write element 230. However, in contrast to the device 200 of FIG. 2, the write unit 430 is configured to control the state of the read unit 432.

In general, the switch 400$t$ can be programmed to one of two magnetic states via the input current $I_{in}$ provided to the write unit 430. To read out the present magnetic state of the device, bias voltages V+ and V− are applied to the read unit 432, producing a current $I_{out}$ that carries the magnetic state information. As will be discussed below in connection with FIGS. 6a, 7, 9 and 10, the switch element 400 may be combined with various similar elements, and with various controlled sources of V+ and V− to create many logical circuits.

The circuit element 400 of FIG. 4 includes a first nanomagnet 402, a second nanomagnet 404, a first current carrying element 406, a second current carrying element 408, a current input 410, a current output 412, first and second biasing impedances 414, 416, a first fixed magnet 418, a second fixed magnet 420, a positive bias input 422, a negative bias input 424, and at least one oxide layer 426.

Figure 1:
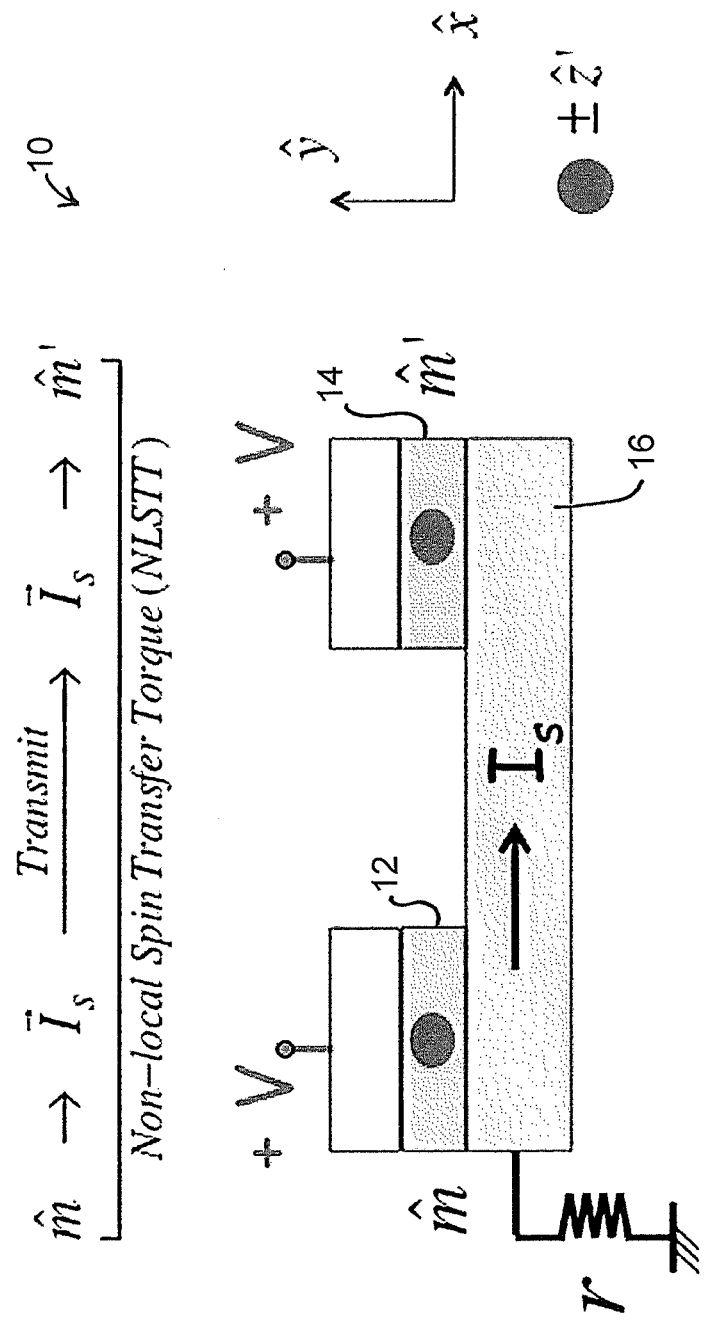
FIG. 1 shows a schematic block diagram of a prior art an all-spin logic device.

The first nanomagnet 402 and the second nanomagnet 404 may suitably have the same structure as the nanomagnets 202, 204 of FIG. 2 or the nanomagnets 12, 14 of FIG. 1. In this embodiment, however, the first nanomagnet 402 and the second nanomagnet 404 are magnetically coupled. By magnetically coupled, it is meant that a change in the magnetic state of the first nanomagnet 402 is induced magnetically on the second magnet 404. Thus, the magnetic angle θ between the nanomagnets 402, 404 always has a substantially fixed value. The interaction could be ferromagnetic, making θ=0, or anti-ferromagnetic, making θ=π. What is important is that θ be a fixed value independent of inputs and outputs. In this embodiment an antiferromagnet interaction that keeps the nanomagnets 402, 404 in anti-parallel is assumed. As will be discussed below, this causes the switch 400 to operate as a logical inverter.

As shown in FIG. 4, the first nanomagnet 402 is inductively coupled to the first current carrying element 406. The first nanomagnet 402 is configured to change polarity (i.e. magnetic state) responsive to current in the first current carrying element 406. To this end, the first current carrying element 406 in this embodiment is a GSHE substrate 406. The first nanomagnet 402 is disposed on a surface of the GSHE substrate 406 in the same manner that the second nanomagnet 204 is disposed on the surface of GSHE substrate 214 of FIG. 2. The current input 410 is operably and conductively coupled to a first end 406a of the GSHE substrate 406. The first impedance 414 is coupled proximate a second end 406b of the GSHE substrate 406, such that an input current $I_{in}$ flows between the first end 406a and the second end 406b of the GSHE substrate 406, and adjacent to the first nanomagnet 402.

As discussed above, the second nanomagnet 404 is magnetically coupled to the first nanomagnet 402. To this end, the second nanomagnet 404 may suitably be disposed immediately above the first nanomagnet 402, even though for purposes of clarity the second nanomagnet 404 is shown in FIG. 4 as being disposed beside the first nanomagnet 402. The second nanomagnet 404 is inductively coupled to the second current carrying element 408. The second current carrying element 408 may suitably be any conductive medium, such as one constructed of metal. The current output 412 is operably connected to the second current carrying element 408, and the second impedance 416 is coupled between the current output 412 and ground.

The first fixed magnet 418 is disposed proximate the second nanomagnet 404 and has a first fixed polarity. The first fixed magnet 418 is arranged on the second nanomagnet 404 in the same manner as the first fixed magnet 206 is arranged on the first nanomagnet 202 of FIG. 2. Thus, the at least one oxide layer 426 is disposed between the first fixed magnet 418 and the second nanomagnet 404. The second fixed magnet 420 is disposed on the second nanomagnet 404 in a similar manner and has a second fixed polarity. The at least one oxide layer 426 is disposed between the second fixed magnet 420 and the second nanomagnet 404. The first bias input 422 is operably coupled to the first fixed magnet 418 and the second bias input 424 is operably coupled to the second fixed magnet 420.

In operation, the switch 400 has two steady states. In a first state, the first nanomagnet 402 is in a first magnetic state, and the second nanomagnet 404 is in the opposite or second magnetic state (i.e. polarity). In the second state, the first nanomagnet 402 is in the second magnetic state and the second nanomagnet 404 is in the first magnetic state. In general, the current input 410 may be used to "write" information to the device 400, whereby the steady state of the circuit element 400 may be changed. The bias inputs 422, 424, on the other hand, may be used to read the current state of the circuit element 400 via the current output 412.

A first write operation involves applying a positive input current $I_{in}$ to the current input 410. Assuming the applied current $I_{in}$ has sufficient magnitude (discussed further below), the positive input current causes the switch 400 to be in the first state. A second write operation involves applying a negative input current $I_{in}$ to the current input 410. Assuming the current magnitude is sufficient, the negative input current causes the switch 400 to be in the second state. It will be appreciated that the circuit element 400 has hysteresis, and a certain of positive or negative current is required to change the current state.

Assuming a positive current $I_{in}$ is provided to the current input 410, the current $I_{in}$ propagates through the GSHE substrate 406 to the first impedance 414. Because the current input 410 and the first impedance 414 are proximate opposing ends 406a, 406b, respectively of the GSHE substrate 406, the current $I_{in}$ flows past the surface of the first nanomagnet 402. The GSHE substrate 406 generates the spin Hall effect to split off up spin electrons e+ and the down spin electrons e− in a manner that induces the first nanomagnet 402 to be in the first magnetic state, similar to the operation of the GSHE substrate 214 of FIG. 2. It will be appreciated that if the first nanomagnet 402 is already in the first magnetic state, then the current $I_{in}$ has no effect. If, however, the first nanomagnet 402 was previously in the second magnetic state, then the current $I_{in}$ operates as described above to change the first nanomagnet 402 to the first magnetic state. The first nanomagnet 402 furthermore induces magnetic force on the second nanomagnet 404 via the magnetic coupling, thereby causing the second nanomagnet 404 to change state to the second magnetic state. It will be appreciated that the current $I_{in}$ must satisfy the condition $I_{in} \geq I_{s,c}/\beta$ to cause the first nanomagnet 402 to change state. This feature of requiring currents of sufficient magnitude can be used to generate complex combinations of circuit devices 400 that employ various levels of current in combination to force a change in state, as will be discussed further below in connection with FIGS. 7, 9 and 10.

Accordingly, assuming a positive current $I_{in}$ (i.e. flowing from the input 410 to the impedance 414) of sufficient magnitude is received at the current input 410, then the circuit device 400 can change from the second state to the first state. Otherwise, a positive current $I_{in}$ has no effect.

Similarly, if a negative current $I_{in}$ of sufficient magnitude ($I_{in} \geq I_{s,c}/\beta$) is received at the current input 410 (i.e. flowing from the impedance 414 to the current input 410), then the circuit device 400 can change from the first state to the second state. In particular, the negative current $I_{in}$ propagates through the GSHE substrate 406 from the first impedance 414 to the current input 410, past the surface of the first nanomagnet 402. The GSHE substrate 406 employs the spin Hall effect to split off up spin electrons e+ and the down spin electrons e− in a manner that induces the first nanomagnet 402 to be in the second magnetic state, similar to the operation of the GSHE substrate 214 of FIG. 2. The first nanomagnet 402 furthermore induces magnetic force on the second nanomagnet 404 via the magnetic coupling, thereby causing the second nanomagnet 404 to be in the first magnetic state. As with the positive current discussed above, if the negative current $I_{in}$ is insufficient to cause the first nanomagnet 402 to overcome the resisting force of the second nanomagnet 404, then the states of the first nanomagnet 402 and the second nanomagnet 404 do not change.

While the above operations illustrate how information is written to the switch 400 using the write unit 430, it is the application of bias voltages to the bias inputs 422, 424 to the read unit 432 that reads out the written information. To read out information, a positive bias voltage V+ is applied to the first bias input 422, and a negative bias voltage V− is applied to the second bias input 424. As discussed above in connection with the operation of the fixed magnets 206, 208 and nanomagnet 202 of FIG. 2, the present magnetic state of the second nanomagnet 404 creates a magnetic tunnel junction between either the first fixed magnet 418 and the nanomagnet 404, or the second fixed magnet 420 and the nanomagnet 404. As a consequence, if the second nanomagnet 404 is in the first magnetic state, then the conductance from the first bias input 422 (with the positive bias voltage) and the output 412 is increased, and positive current $I_{out}$ flows from the first bias input 422 to the current output 412. Contrariwise, if the second nanomagnet 404 is in the second magnetic state, then the conductance from the second bias input 424 (with the negative bias voltage) and the output 412 is increased, and negative current $I_{out}$ flows from the first bias input 424 to the current output 412.

As a consequence, by providing suitable positive and negative voltages on the inputs 422, 424, the state of the circuit device 400 can be determined by the sign of the current at the current output 412. It will be appreciated that the magnitude of the output current (for either direction) can be adjusted by adjusting the magnitude of the bias voltages V+ and/or V−. As will be discussed below, adjustment of these voltages may be used to create combinatorial gates of the multiple units of the circuit device 400.

Figure 5A:
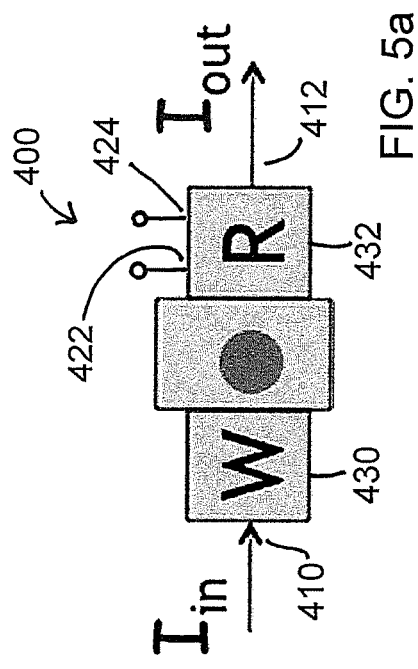
FIG. 5a shows an abbreviated schematic representation of the switch device of FIG. 4.

FIG. 5*a* shows an abbreviated schematic representation of the switch device 400 of FIG. 4. The circuit device 400 includes the current input 410, the current output 412, the first bias input 422, the second bias input 424, the write unit 430, and the read cell 432. The representation of FIG. 5*a* is useful for showing circuits containing multiple of such devices.

Figure 5B:
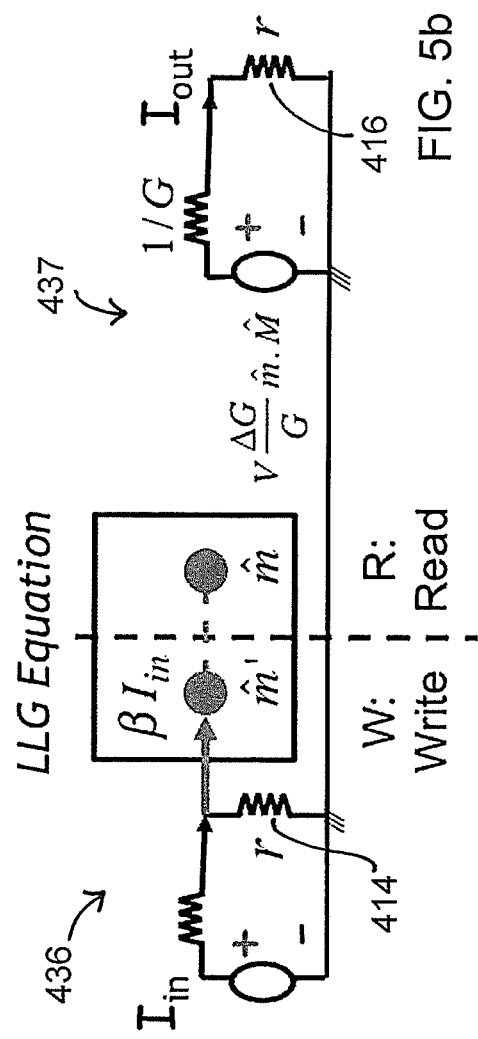
FIG. 5b shows a schematic diagram of the equivalent circuit of the switch device of FIG. 4.

FIG. 5*b* illustrates the equivalent circuit of the switch device 400, wherein the values $I_{in}$, $I_{out}$ are the same as the corresponding values of FIG. 4. The input current $I_{in}$ through Eq. (2), discussed above in connection with FIG. 3 determines the spin current $\beta I_{in}$ entering the nanomagnet 402 (represented in FIG. 5*b* as $\hat{m}'$) whose easy axis $\hat{Z}$ is assumed to make a small angle (~0.1 radian) with the direction $\hat{z}$ of the spins so as to speed up the switching process. The output circuit describes the output current $I_{out}$ which is determined by the output nanomagnet 404 (represented in FIG. 5*b* as $\hat{m}$) and the associated fixed magnets 418, 420 (represented in FIG. 5*b* as $\pm \hat{M}$) through Eq. (1).

Given that the nanomagnet 404 (like the nanomagnet 402) has its easy axis along $\hat{Z}$, and the two fixed magnets 418 and 420 point along $+\hat{Z}$ and $-\hat{Z}$ respectively, so that $I_{out}$ is governed by $$I_{out} = +\frac{V \Delta G}{1 + rG} \text{ or } -\frac{V \Delta G}{1 + rG} \quad (3)$$

depending on whether the nanaomagnet 404 points along (or aligns with) the first fixed magnet 418 or the second fixed magnet 420.

Figure 5C:
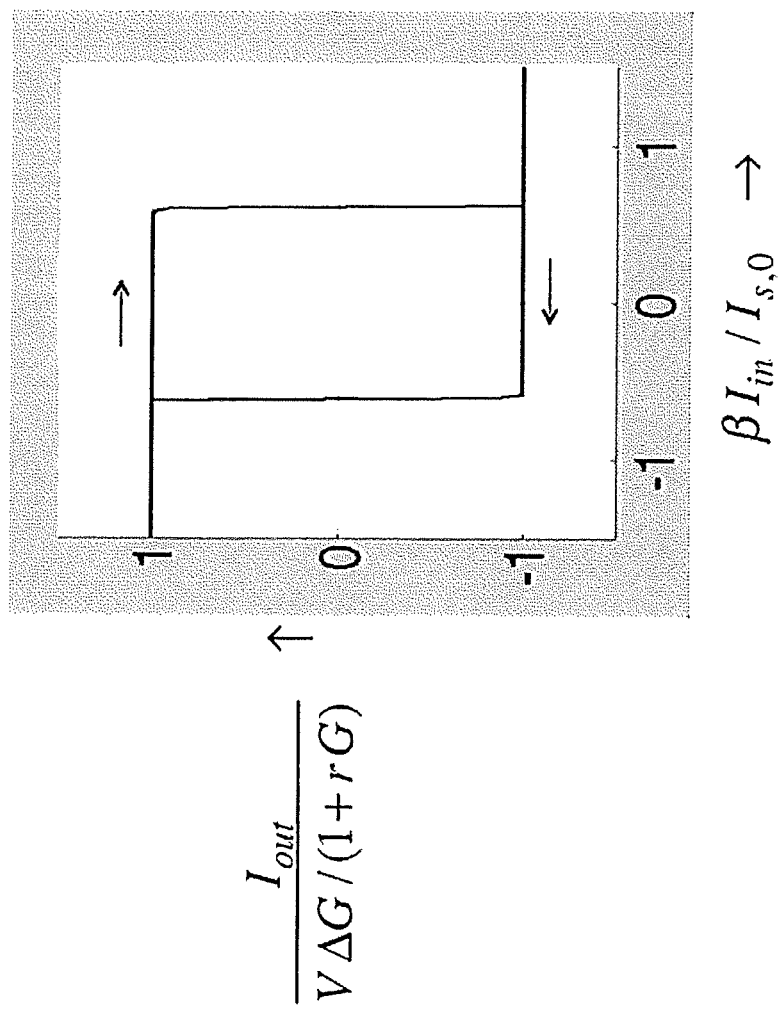
FIG. 5c shows the input/output characteristic for the switch of FIG. 4.

To see why the spin switch should give rise to the input-output characteristics in FIG. 5*b*, it should be that if the current $I_{in}$ entering the write unit 430 is large enough to generate a spin current $\beta I_{in}$ through the GSHE substrate 406 that exceeds the critical value of $I_{s,c}$, it will switch the nanomagnet 402 to the $+\hat{Z}$ direction, putting the other nanomagnet 404 of the pair in the $-\hat{Z}$ direction, so that the output current $I_{out} = -V \Delta G/(1+rG)$ (see Eq. (3)). If the input current $I_{in}$, however, is reversed beyond the critical value, then the nanomagnets 402, 404 are switched in the opposite direction with a reversal of the output current, resulting in a hysteretic inverter-like characteristic as shown in FIG. 5*c*. FIG. 5*c* shows the input/output characteristic for the switch 400 of FIG. 4. Note that the sign of $I_{out}/I_{in}$ in FIG. 5*c* could be changed by reversing either the sign of the β or the V associated with the write unit 430 and the read unit 432, respectively. Thus, as discussed above, it is possible to create a non-inverting device 400 by merely changing the voltages applied to the bias inputs 422, 424.

A more detailed quantitative analysis can be carried out using a pair of LLG equations to model the pair of nanomagnets 402, 404 as two macrospins $\hat{m}'$ and $\hat{m}$, respectively, coupled by the dipolar interaction.

$$(1 + \alpha'^2)\frac{d\hat{m}'}{dt} = -|\gamma|\mu_0 \hat{m}' \times \vec{H}' - \quad (4a)$$

$$\alpha'|\gamma|\mu_0 \hat{m}' \times \hat{m}' \times \vec{H}' - \hat{m}' \times \hat{m}' \times \frac{\vec{I}_s'}{qN_s'} + \alpha' \hat{m}' \times \frac{\vec{I}_s'}{qN_s'}$$

-continued $$(1 + \alpha'^2)\frac{d\hat{m}}{dt} = \quad (4b)$$

$$-|\gamma|\mu_0 \hat{m} \times \vec{H} - \alpha|\gamma|\mu_0 \hat{m} \times \hat{m} \times \vec{H} - \hat{m} \times \hat{m} \times \frac{\vec{I}_s}{qN_s} + \alpha \hat{m} \times \frac{\vec{I}_s}{qN_s}$$

Here γ is the gyromagnetic ratio, α, α', the damping parameter and $N_s = M_s V/\mu_B$, $N_s' = (M_s V)'/\mu_B$ are the number of spins comprising each magnet ($\mu_B$: Bohr magneton). Also, $$\vec{H} = H_k m_z \hat{Z} - H_d m_y \hat{y} - H_f \hat{m}' \quad (5a)$$

$$\vec{H}' = H'_k m'_z \hat{Z} - H'_d m'_y \hat{y} - H_b \hat{m} \quad (5b)$$

represent the easy axis fields (Hk, H'k), the demagnetizing fields ($H_d$, $H'_d$) plus the dipolar fields.

An exact treatment of the dipolar fields would require a detailed consideration of the shape of each magnet, but the approximate expression in Eqs. 5(a) and 5(b) should be adequate with $H_f = (M_s A_s)'/d^2$, $H_b = (M_s A_s)/d^2$, $M_s$, $M_s'$ being the saturation magnetizations, $A_s$, $A_s'$, the areas (in x-z plane) and d, the distance (along x) between the magnets.

Since it is desired for the Write (first) nanomagnet 402 ($\hat{m}'$) to switch the Read (second) nanomagnet 404 ($\hat{m}$), it helps speed up the process if the forward interaction $H_f$ is designed to be larger than the backward one $H_b$. The simplest way to achieve this is to make the write magnet 402 larger than the read magnet 404, but more sophisticated approaches based on engineering material parameters may be possible too.

The input-output characteristics shown in FIG. 5*c* were obtained numerically by solving Eqs. (4a) and (4b) assuming the following parameters:

α=0.01, $H'_k = H_k$, $H'_d = H_d = 50 H_k$, $H_f = 1.1 H_k$, $H_b = 0.9 H_k$

The normalizing factor $I_{s,0}$ is defined as $I_{s,0} = qN_s|\gamma|\mu_0 H_k = (2q/\hbar)\mu_0 H_k M_s V$ With $H_k = 200$ Oe, $M_s = 10^6$ A/m and magnet dimensions 100 nm×80 nm×1.6 nm, (FIG. 3*d*), $I_{s,c} \approx 0.6$, $I_{s,0} \approx 460$ μA Smaller critical currents are obtained if a forward to backward dipolar interaction ratio larger than the present one (11:9) is assumed.

Combinations of switches having the structure of the switch 400 necessarily involve connecting the read unit 432 of first switch 400 with a write unit, not shown, of a further switch, not shown. Assuming the write unit of the further switch has a β of 8 as estimated earlier following Eq. (2), this would require an input current of ~60 μA from the read circuit 432 of the first switch 430. With a ΔG of 0.25 mS as estimated earlier for 100 nm×80 nm cross-section, this would need a V~250 mV. Note that that the read currents are ~(⅛) of the write current and the simulations based on Eqs. (4) show that they do not interfere significantly with the writing process, except to slow it or speed it up a little. Indeed larger read currents should be possible allowing a fan-out of 2 to 4. This is a key feature arising from the charge to spin gain associated with the SHE.

FIG. 5*c* shows the I/O characteristic of the circuit device 400, normalized. It will be appreciated that in this case, the circuit device 400 is configured as an inverter, wherein the first nanomagnet 402 has the opposite magnetic state from the second nanomagnet 404. Thus, when a positive current is received at the current input 410, the first nanomagnet 402 changes to the first magnetic state and the second nanomagnet 404 changes to the second magnetic state. When the circuit device 400 is read out, the output current would be negative. It will be appreciated that the circuit device 400 can be readily configured as either an inverting or a non-inverting device as desired. For example, the inverting/non-inverting configuration can be carried out via the physical placement of the bias inputs 422, 424, or even by selective application of the positive and negative bias voltages on the bias inputs 422, 424. For example, it will be appreciated that if applying a positive bias voltage on the bias input 422 and a negative bias voltage on the bias input 424 produces a non-inverting device then applying a negative bias voltage on the bias input 422 and a positive bias voltage on the bias input 424 will produce an inverting device.

Figure 6A:
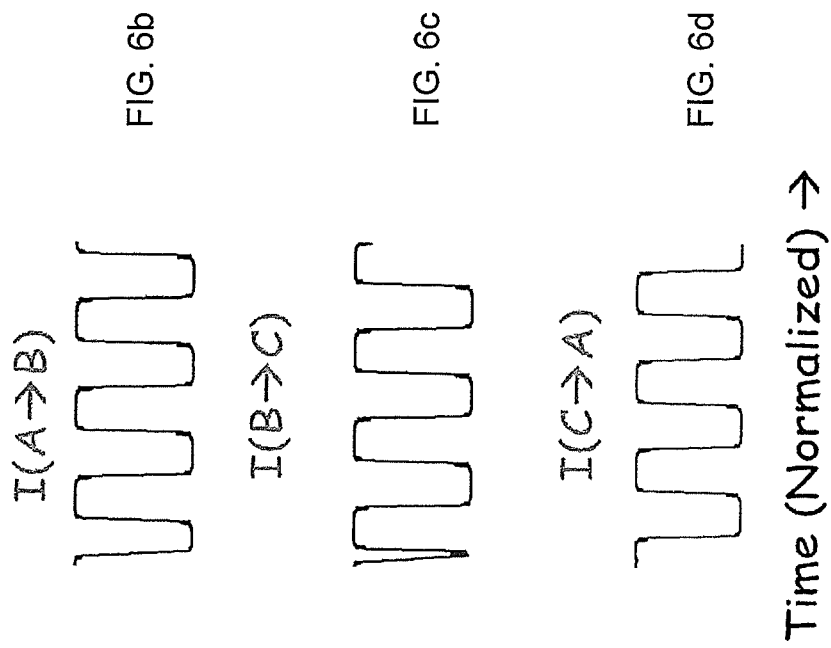
FIG. 6 shows a schematic diagram of a first embodiment of a circuit that employs a plurality of circuit devices, each having the general design of the switch of FIG. 4.
Figure 6A:
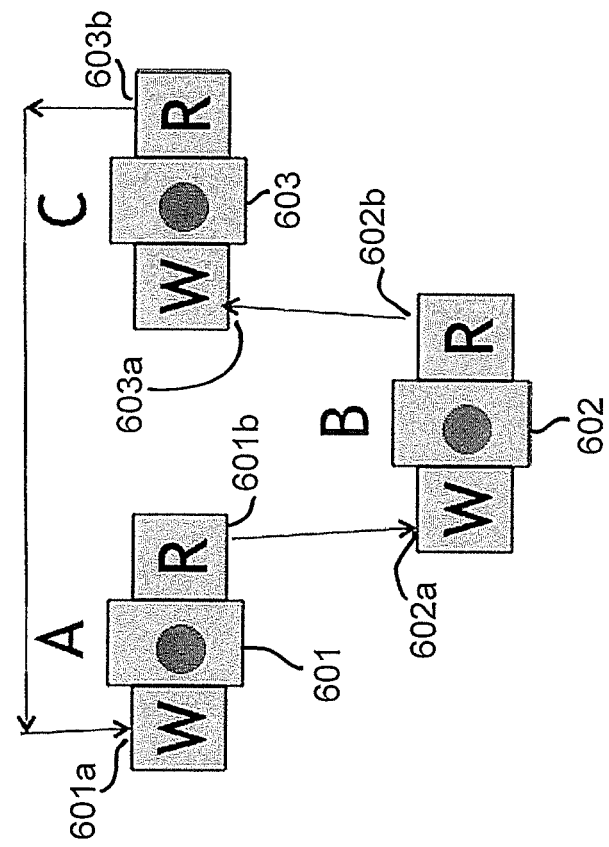

FIG. 6 shows a schematic diagram of a first embodiment of a circuit 600 that employs a plurality of circuit devices 601, 602, 603, each of the circuit devices 601, 602, 603 having the general design of the switch 400. In this embodiment, the devices 601, 602, 603 are configured as inverting devices. The circuit 600 of FIG. 6 is configured as a ring oscillator. In particular, the current output of read unit 601b of the first device 601 is coupled to the current input of the write unit 602a of the second device 602, the current output of the read unit 602b of the second device 602 is coupled to the current input of the write unit 603a of the third device 603, and the current output of the read unit 603b of the third device 603 is coupled to the current input of the write unit 601a of the first device 601. In this configuration, a control circuit, not shown in FIG. 1, provides constant positive and negative voltage to the respective bias inputs (not shown, but which are similar to bias inputs 422, 424) of the read units 601b, 602b, 603b.

In an exemplary operation, the first device 601 provides a positive current from its read unit 601b to the second device 602. In response to receiving the positive current, the second device 602 generates a negative current at its read unit 602b. The second device 602 thereby provides the negative current to the write unit 603a of the third device 603. The third device 603 receives the negative current and generates a positive current at its read unit 603b responsive thereto. The third device 603 provides the positive current to the write unit 601a of the first device 601 via the read unit 603b. The first device 601 receives the positive current and generates a negative current therefrom. The first device 601 provides the negative current from its read unit 601b to the second device 602. Thus, due to the inverter operation provided by each of the devices 601, 602, 603, the current at the current output of the read unit 601b changes from a positive output, discussed further above, to a negative output. A corresponding change occurs in the output current at each of the devices 602, 603. Because there are an odd number of inverting devices 601, 602, 603, no steady state is reached and an oscillator is formed. FIGS. 6b, 6c and 6d show the resulting output signal patterns of the devices 601, 602 and 603, respectively.

As discussed further above, it is also possible to manipulate the bias voltages to create more complex analog/digital logical structures. For example, it is possible to interconnect the spin switches having the design of the circuit device 400 to implement hardware neural networks like the non-limiting example shown in FIG. 7. In particular, FIG. 7 shows a schematic diagram of a neural network circuit 700 that includes a plurality of devices 702$_{1,1}$, 702$_{1,2}$, 702$_{2,1}$, etc., each having the general design of the switch 400 of FIG. 4.

Figure 7:
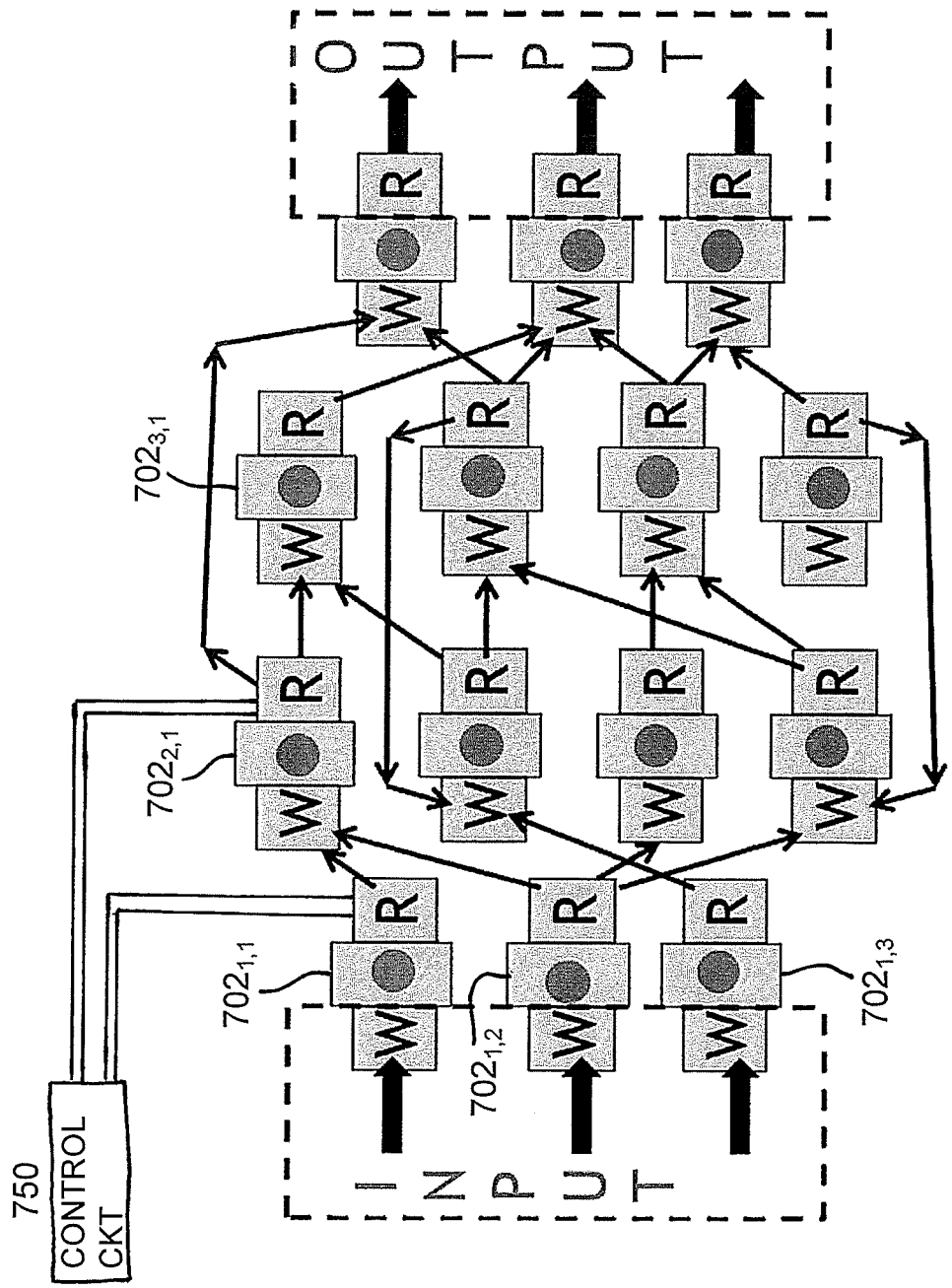
FIG. 7 shows a schematic diagram of a second embodiment of a circuit that includes a plurality of devices, each having the general design of the switch of FIG. 4.

In FIG. 7, the plurality of devices 702$_{1,1}$, 702$_{1,2}$, 702$_{2,1}$, etc. have their bias inputs (e.g. inputs 422, 424 of FIG. 4) connected to a control circuit 750. Each device 702$_{x,y}$ constitutes a node x, y of the neural network circuit 700. The connections between nodes x, y are the connections between the read unit (e.g. 432 of FIG. 4) of one node $x_i$, $y_i$ to the write unit (e.g. 430 of FIG. 4) of the connected downstream node $x_j$, $y_j$. Such connections are modeled by the device 200 of FIGS. 2 and 3, which show a read unit 230 coupled to a write unit 232. Each node has a predetermined weight $a_{x,y}$ determined by the control circuit 750. In particular, the control circuit 750 preferably provides a predetermined set of bias voltages $V_{x,y}$ to each device 702$_{x,y}$ that corresponds to the node weight $a_{x,y}$. Both the sign and the magnitude of the weights $a_{x,y}$ associated with each device 702$_{x,y}$ can be conveniently adjusted by the control circuit 750 through the voltages $V_{x,y}$.

In general, the plurality of devices 702$_{1,1}$, 702$_{1,2}$, 702$_{2,1}$, etc. can interconnected in a combinatorial manner to carry out any neural network design having a set of interconnected nodes and a set of weights associated with each of the nodes. The devices 702$_{1,1}$, 702$_{1,2}$, 702$_{2,1}$, etc. represent the nodes, and the weights are implemented via the corresponding voltages $V_{1,1}$, $V_{1,2}$, $V_{2,1}$, etc. provided to the bias inputs (e.g. inputs 422, 424) of each device 702$_{i,j}$ by the control circuit. Adjusting the size or area of the first (write) nanomagnet (e.g. nanomagnet 402) may also be used to adjust the weighting factors. For example, by making the first (write) nanomagnet smaller in a node x, y, it will require a greater sum of currents from the various devices that feed the node x, y.

Using present day technology it should be possible to implement weights large enough to exceed switching thresholds, but even subthreshold networks could find use in probabilistic logic as discussed for ASL in B. Behin-Aein, A. Sarkar and S. Datta, "Modeling spins and circuits for all-spin logic", Proc. ESSDERC (2012), which is incorporated herein by reference.

It should be noted that ordinarily it may be advisable to use resistances $r_j$ (e.g. 414, 416 of FIG. 4) that are much lower than the output conductance $G_{tot}$ set by the magnetic tunnel junction in all devices that feed into a device 702$_{x,y}$ so that this factor is negligible. On the other hand the impedance r could be a phase change resistance that could provide an automatic adjustment of weights, making it possible for a network to "learn."

Figure 8:
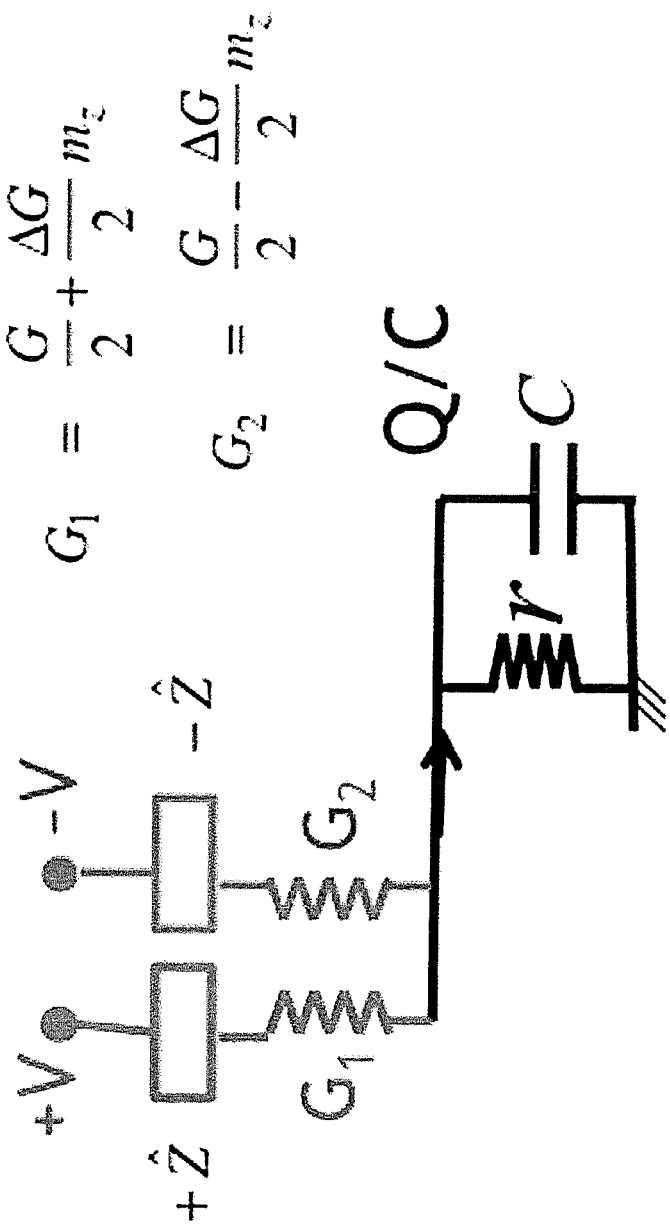
FIG. 8 is a schematic diagram of an equivalent circuit for an alternative embodiment of the circuit of FIGS. 2 and 3.

Referring again to FIG. 3, one drawback of the structure in FIG. 2, which models the read unit to write unit signal propagation of FIG. 7 as discussed above, can be the standby current which could be avoided by replacing the resistor "r" with a capacitor. Below, a simulated operation of a majority gate with fan-out including capacitors in parallel with the "r". FIG. 8 is a schematic of an equivalent circuit for a single read unit driving a single write unit (same as FIG. 3, but redrawn to include the capacitor C as part of the impedance 216). Other possible approaches include the use of a voltage driven writing mechanism instead of a current-driven one.

Figure 9:
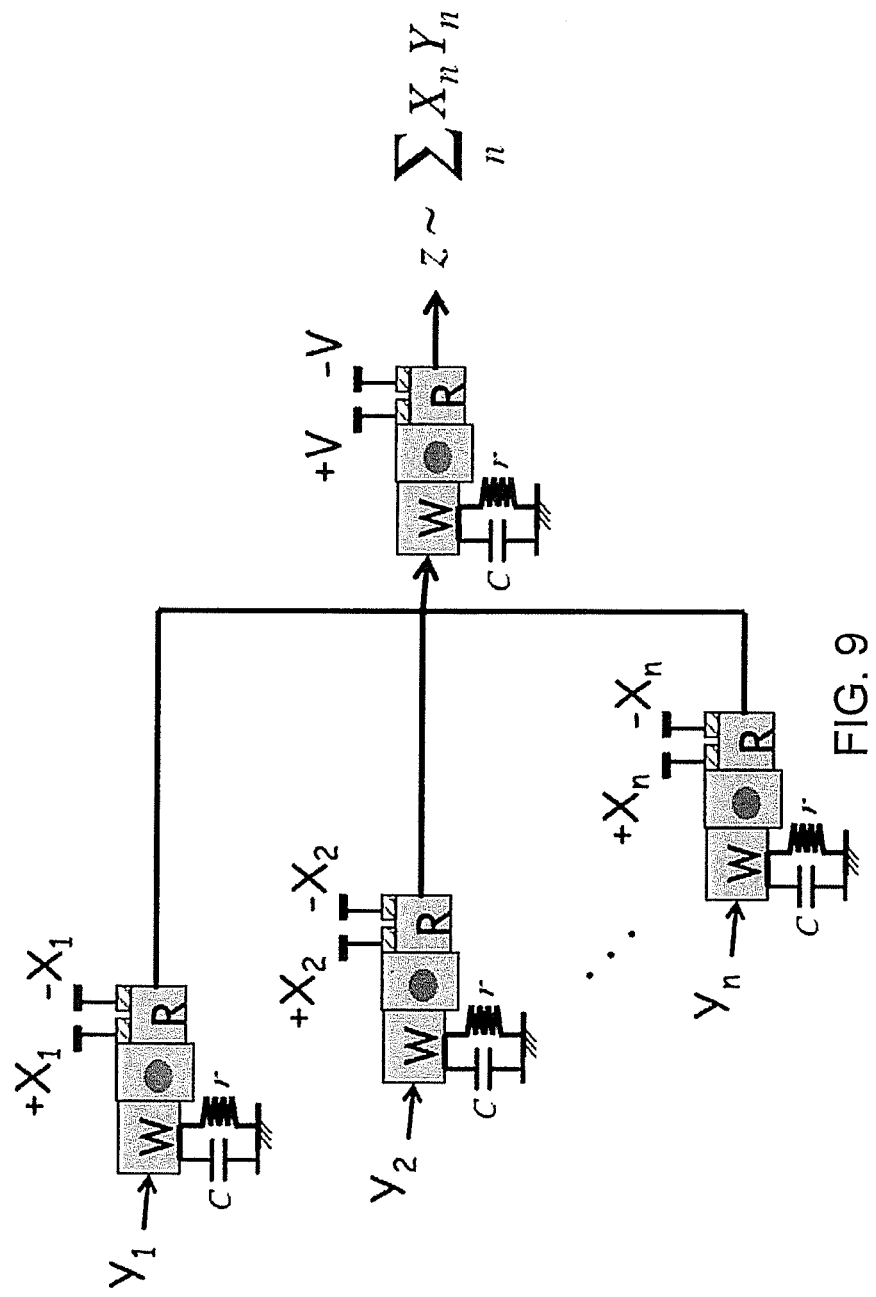
FIG. 9 shows a schematic diagram of a third embodiment of a circuit that includes a plurality of devices, each having a modification of the general design of the switch of FIG. 4.

One advantage of the devices of FIGS. 2 and 4 is that a voltage supply (e.g. from the control circuit 750) is not needed for digitization. The digitization comes from the nanomagnets (e.g. 402, 404). Thus, the bias voltages can be adjusted in an analog manner to provide both positive and negative interconnection weights for neural networks. For example, FIG. 9 shows a device that could be implemented by interconnecting the spin switches having the design of the switch of FIG. 4 according the present disclosure which provides an output that correlates the incoming signal $\{X_n\}$ with a reference signal $\{Y_n\}$ stored in the $m_z$ of the switches that could be any string of +1's and −1's of length N, N being a large number.

Since the output current (see Eq. (1)) of each Read unit is a product of V (~$X_n$) and $m_z$ (~$Y_n$), it is determined by $X_n Y_n$ which are all added up to drive the output magnet. If {X} is an exact match to {Y}, then the output voltage will be N, since every $X_n*Y_n$ will equal +1, being either +1*+1 or −1*−1. If {X} matches {Y} in (N−n) instances with n mismatches, the output will be N−(2*n) since every mismatch lowers output by 2. If the threshold for the output magnet is set to N−(2*Ne) then the output will respond for all {X} that matches the reference {Y} within a tolerance of Ne errors.

Other novel applications are possible based on the fact that since magnets provide the digitization, the voltages can be used for "weighting" instead of "gating."

Figure 10:
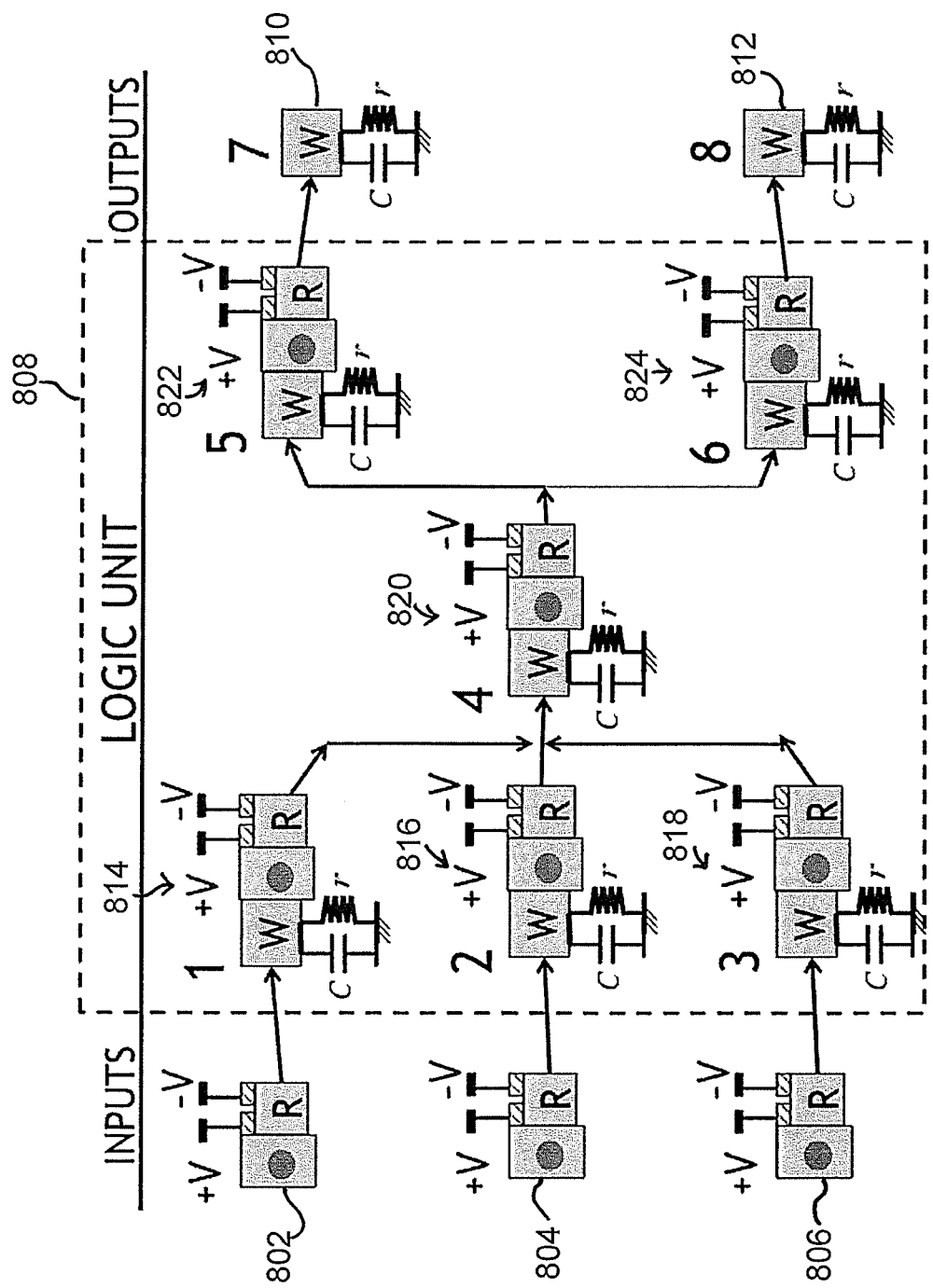
FIG. 10 shows a schematic diagram of a fourth embodiment of a circuit that includes a plurality of devices, each having a modification of the general design of the switch of FIG. 4.

Below a simulation illustrating the operation of a multi-stage Boolean gate constructed using the basic circuit devices 400 discussed above is provided. FIG. 10 shows, for example, a majority gate with three input devices 802, 804 and 806, a logic circuit 808, and two output devices 810, 812. The logic circuit 808 include three first-stage devices 814, 816, 818 coupled to a second-stage device 820, which is in turn coupled to two third-stage devices 822 and 824. The input devices 802, 804, 806 may each suitably have the structure of a read unit 432 of FIG. 4, and the output devices 810, 812 may each suitably have the structure of the write unit 430 of FIG. 4. Each of the devices 814, 816, 818, 820, 822, and 824 may each suitably be a switch having the structure of the switch 400 of FIG. 4.

The first-stage devices 814, 816, 818 drive the second-stage device 820, which in turn drives the two third-stage devices 822 and 824. The two third-stage devices 822 and 824 drive the write unit output devices 810, 812. For generality, a capacitor C has been added in parallel with the resistor r in the write units of the devices 814, 816, 818, 820, 822, and 824.

Since this gate includes six switches/devices 814, 816, 818, 820, 822, and 824, each having a write and a read unit, the dynamics of twelve magnetization vectors $\hat{m}_{1W}, \hat{m}_{1R}, \ldots, \hat{m}_{6W}, \hat{m}_{6R}$ described by LLG equations (Eq. (4)) need to be modeled. An expression is needed for the spin currents driving the different write units which are derived from the read units of the previous stage. Again, this relationship is similar to that of FIGS. 2 and 3. In addition there are spin currents driving the read units arising from the fixed magnets $\pm\hat{M}=\pm\hat{Z}$. These unwanted read spin currents affect the dynamics of the magnets, and the amplification associated with the SHE helps keep these small compared to the write spin currents.

Both the read and write spin currents can be determined using the equivalent circuit for a single read unit driving a single write unit (FIG. 3), redrawn here with the additional capacitor C. The Read spin current is obtained from the difference in the currents flowing through $G_1$ and $G_2$:

$$(\vec{I}_s)_{read} = \hat{Z}(G_1(V - Q/C) + G_2(V + Q/C)) \quad (A1)$$
$$= \hat{Z}(VG - \Delta G m_z Q/C)$$

The total current flowing into the Write unit (e.g. units is the sum of the currents flowing through G1 and G2:

$$I = G_1(V-Q/C) - G_2(V+Q/C) = V\Delta G \overline{m_z} - Q/CG$$

However, this is true of a single Read unit driving a single Write unit. With $n_i$ identical Write units driving $n_o$ identical Read units the equivalent circuit is shown in FIG. 11, giving $$I = V\Delta G \frac{\overline{m_z}}{n_o} - \frac{Q}{C} G \frac{n_i}{n_o}$$

The Write spin current equals the amplification factor Q times the charge current:

$$(\vec{I}_s)_{write} = \hat{z}\beta\left(V\Delta G \frac{\overline{m_z}}{n_o} - \frac{Q}{C} G \frac{n_i}{n_o}\right)$$

Figure 11:
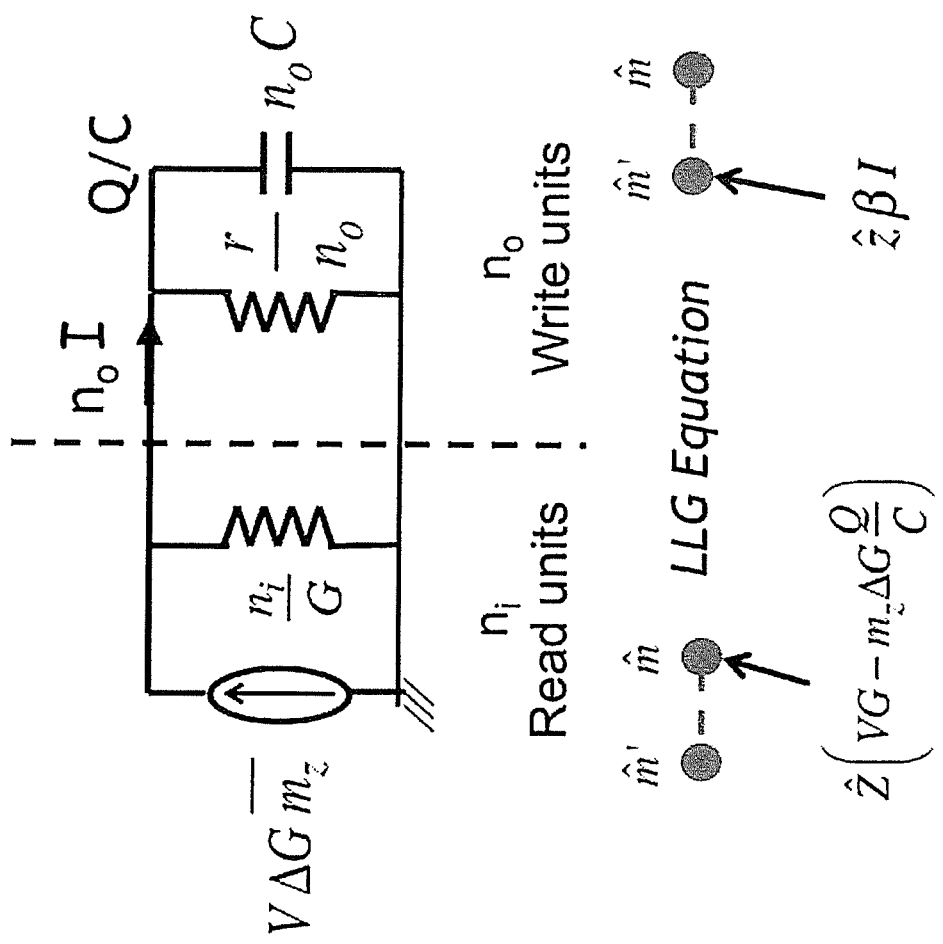
FIG. 11 is a schematic diagram of an equivalent circuit for at least a portion of the circuit of FIG. 10.

Finally the twelve LLG equations for the circuit of FIG. 10 need to be augmented for $d\hat{m}/dt$ with equations for $dQ/dt$ for each of the eight capacitors, which are obtained readily from the equivalent circuit in FIG. 11:

$$\frac{dQ}{dt} = V\Delta G \frac{\overline{m_z}}{n_o} - \frac{Q}{C}\left(\frac{n_i G}{n_o} + \frac{1}{r}\right)$$

Following are some results obtained from the solution of 44 coupled first-order differential equations, 36 for the three components of the twelve magnetization vectors, and 8 for the charge on each capacitor. All W magnets were initialized in the −1 state while the Read magnets were initialized in the +1 state.

It is assumed that $V\Delta G$ equal to $1.5\,q|\gamma|H_k/\beta$, with a TMR of 150% corresponding to $\Delta G/G=0.43$. The time axis is normalized to $|\gamma|H_k/(1+\alpha^2)$ and the currents are normalized to $q|\gamma|H_k$.

Figure 12:
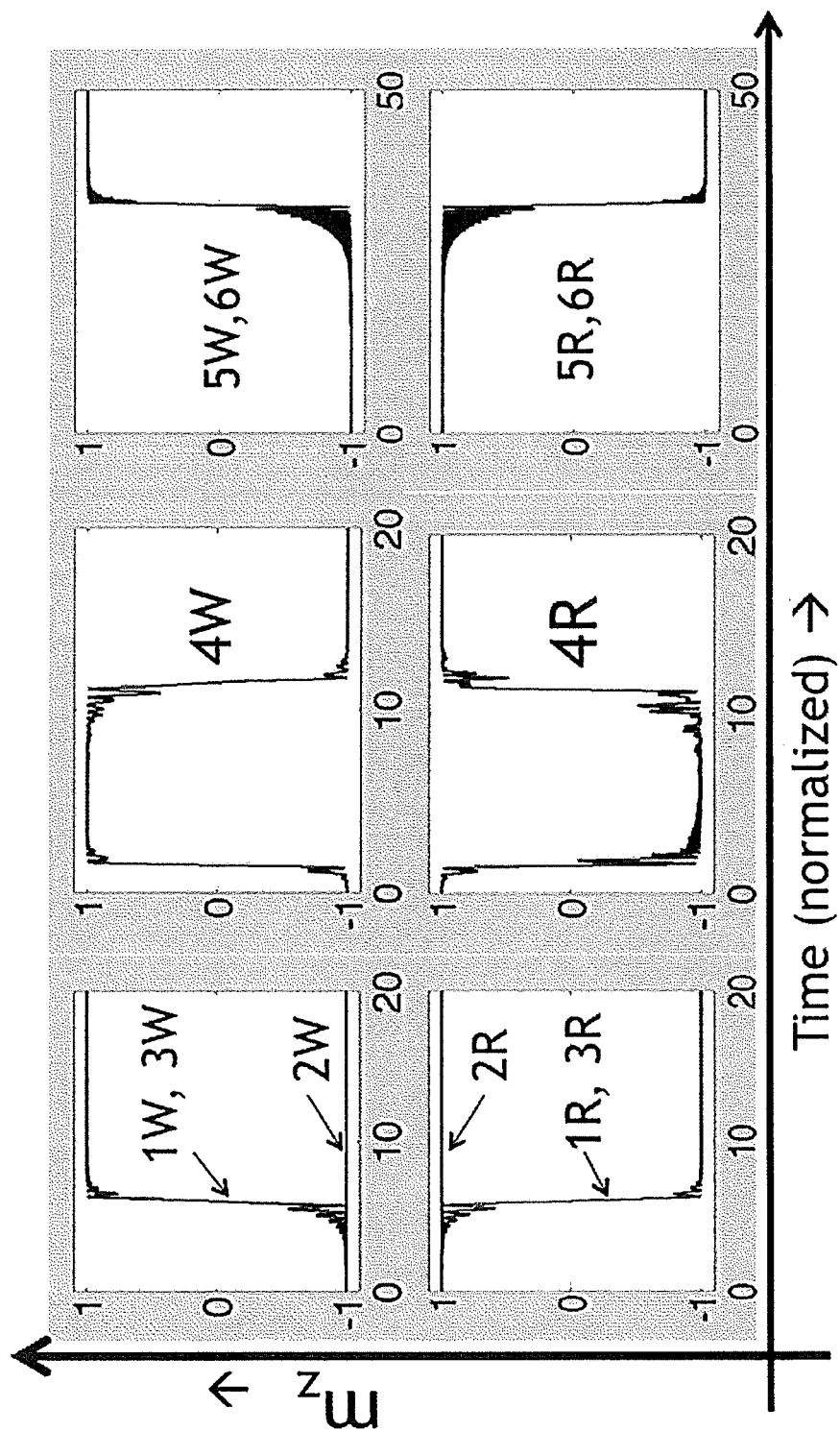
FIG. 12 is a first timing diagram illustrating the operation of the circuit of FIG. 10.

The three inputs were assumed to be +1, −1 and +1, causing both W and R magnets for 1 and 3 to change their states, while magnets 2W and 2R remain in their initial state (FIG. 12). Initially 4W switches to +1 (and 4R to −1) since 1R, 2R and 3R are all initialized to +1. But once 1R and 3R are switched to −1, 4W follows the majority and switches to −1, making 4R switch to +1.5W and 6W then follow 4R and switch to +1, making their dipole coupled partners 5R and 6R switch to −1.

Figure 13:
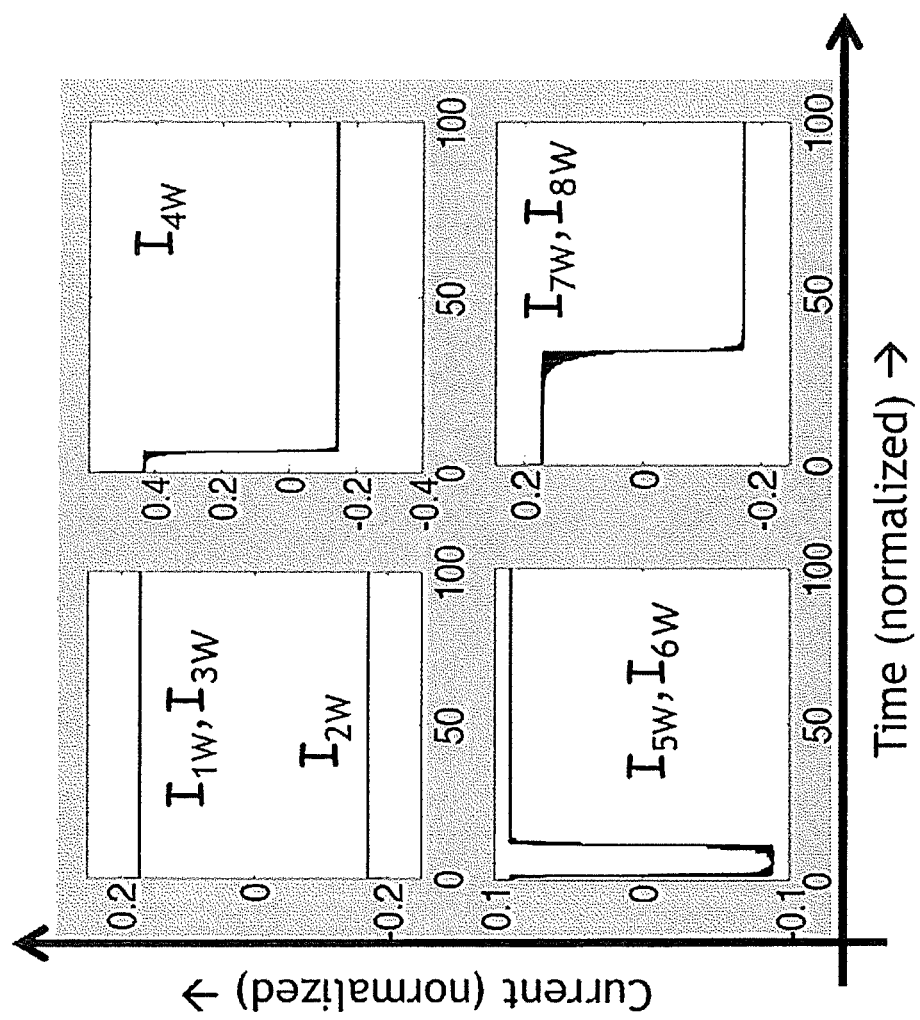
FIG. 13 is a second timing diagram illustrating the operation of the circuit of FIG. 10.

FIG. 13 shows the currents into each of the Write units with no evidence of any capacitor charging effects, because it is assumed r to be very small compared to 1/G (Gr=0.1). In this limit the results are not affected by the size of the capacitor which affects the charging time constant rC/(1+Gr), assumed very short (0.02 in normalized units) in these simulations.

Figure 14:
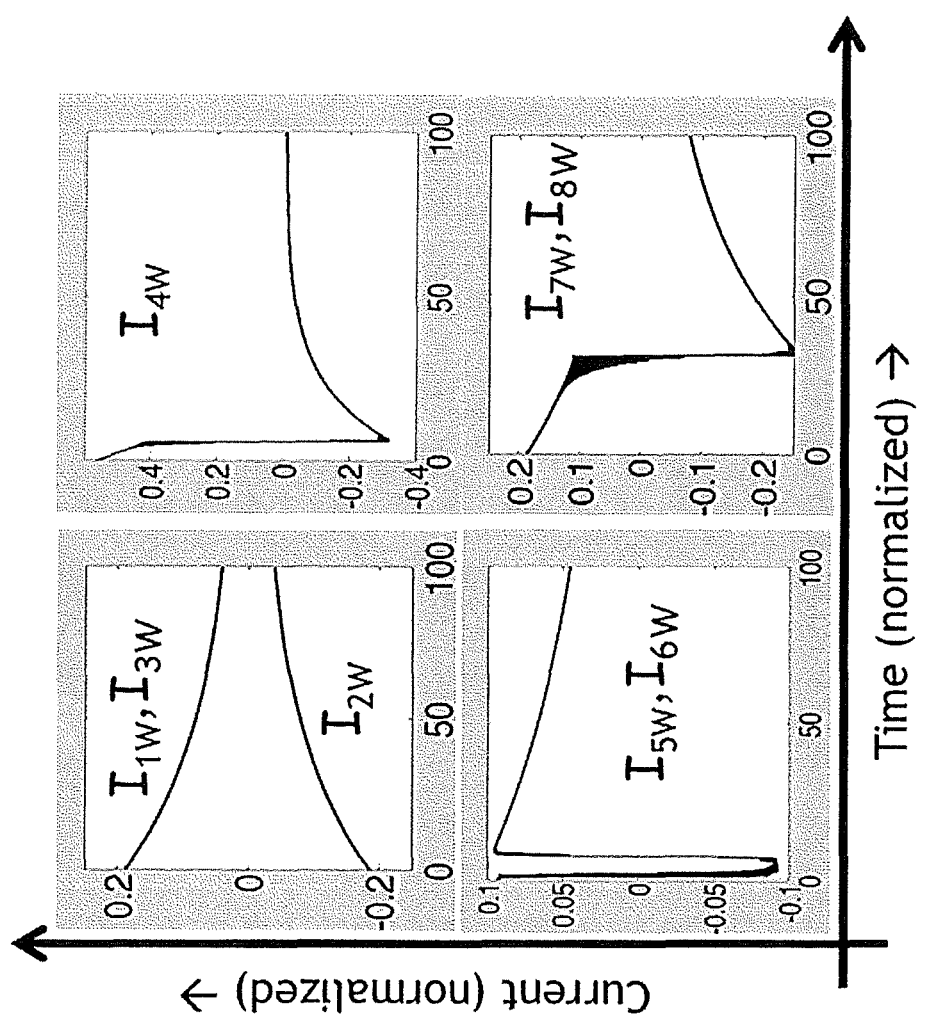

FIG. 14 shows the currents with Gr=10 and a longer time constant (50 in normalized units). The magnetization plots are not changed very much from those in FIG. 9 and are not shown. But the charging effects are now clearly evident in the currents which generally decay to a relatively small value. This feature may be useful in reducing the standby power.

Those skilled in the art will recognize that numerous modifications can be made to the specific implementations described above.

We claim:

1. A circuit element, comprising:
   a first nanomagnet inductively coupled to a first current carrying element, the first nanomagnet configured to change polarity responsive to current in the first current carrying element;
   a second nanomagnet magnetically coupled to the first nanomagnet and inductively coupled to a second current carrying element;
   a first fixed magnet disposed on the second nanomagnet and having a first fixed polarity; and
   a second fixed magnet disposed on the second nanomagnet and having a second fixed polarity.

2. The circuit element of claim 1, further comprising an input coupled to the first current carrying element, and an output coupled to the second current carrying element.

3. The circuit element of claim 1, further comprising a positive voltage source coupled to the first fixed magnet and a negative voltage source coupled to the second fixed magnet.

4. The circuit element of claim 1, wherein the first current carrying element comprises a giant spin Hall effect material.

5. The circuit element of claim 1, wherein the first nanomagnet is constructed of CoFeB.

6. The circuit element of claim 1, further comprising an oxide layer between the first fixed magnet and the second nanomagnet.

7. The circuit element of claim 6, wherein the first fixed magnet and the oxide layer cooperate to form a magnetic tunnel junction when a voltage is applied to the first fixed magnet.

8. A plurality of circuit elements, each circuit element comprising:
a first nanomagnet inductively coupled to a first current carrying element, the first nanomagnet configured to change polarity responsive to current in the first current carrying element;
a second nanomagnet magnetically coupled to the first nanomagnet and inductively coupled to a second current carrying element;
a first fixed magnet disposed on the second nanomagnet and having a first fixed polarity; and
a second fixed magnet disposed on the second nanomagnet and having a second fixed polarity.

9. The circuit of claim 8, wherein each circuit element further comprises:
an input coupled to the first current carrying element,
an output coupled to the second current carrying element, and
wherein the output of a first circuit element is coupled to the input of a second circuit element.

10. The circuit of claim 9, wherein the output of the second circuit element is operably coupled to the input of the first circuit element via a number of intervening circuit elements to form a ring.

11. The circuit of claim 9, wherein the output of the first circuit element is further coupled to the input of a third circuit element.

12. The circuit of claim 11, wherein the output of the third element is further coupled to the input of a fourth circuit element.

13. The circuit of claim 12, wherein each circuit element further comprises:
a first bias input coupled to the first fixed magnet,
a second bias input coupled to the second fixed magnet;
a control circuit operably connected to
provide a first bias voltage to the first bias input of the second circuit element;
provide a second bias voltage to the first bias input of the third circuit element, wherein the first bias voltage and the second bias voltage are different.

14. The circuit of claim 13, wherein the control circuit is further operably connected to provide a first negative bias voltage to the second bias input of the second circuit element and provide a second negative bias voltage to the second bias input of the third circuit element.

15. The circuit of claim 13, further comprising a fifth circuit element, wherein the output of the fifth circuit element is coupled to the input of the second circuit element.

16. The circuit of claim 8, wherein the first current carrying element comprises a giant spin Hall effect material.

17. The circuit of claim 8, wherein the first nanomagnet is constructed of CoFeB.

18. The circuit element of claim 8, further comprising an oxide layer between the first fixed magnet and the second nanomagnet.

19. The circuit element of claim 18, wherein the first fixed magnet and the oxide layer cooperate to form a magnetic tunnel junction when a voltage is applied to the first fixed magnet.

20. A circuit element, comprising:
a first nanomagnet inductively coupled to a first current carrying element, the first nanomagnet configured to change polarity responsive to current in the first current carrying element;
a second nanomagnet magnetically coupled to the first nanomagnet and inductively coupled to a second current carrying element;
a first fixed magnet disposed on the second nanomagnet and having a first fixed polarity;
a second fixed magnet disposed on the second nanomagnet and having a second fixed polarity;
an input coupled to the first current carrying element, and an output coupled to the second current carrying element; and
a positive voltage source coupled to the first fixed magnet and a negative voltage source coupled to the second fixed magnet.

* * * * *